(12) United States Patent
Bassett et al.

(10) Patent No.: US 10,262,880 B2
(45) Date of Patent: Apr. 16, 2019

(54) COVER PLATE FOR WIND MARK CONTROL IN SPIN COATING PROCESS

(71) Applicant: Tokyo Electron Limited, Tokyo (JP)

(72) Inventors: Derek W. Bassett, Cedar Park, TX (US); Wallace P. Printz, Austin, TX (US); Joshua S. Hooge, Austin, TX (US); Katsunori Ichino, Kumamoto (JP); Yuichi Terashita, Koshi (JP); Kousuke Yoshihara, Koshi (JP)

(73) Assignee: Tokyo Electron Limited, Tokyo (JP)

(*) Notice: Subject to any disclaimer, the term of this patent is extended or adjusted under 35 U.S.C. 154(b) by 1372 days.

(21) Appl. No.: 13/770,771

(22) Filed: Feb. 19, 2013

(65) Prior Publication Data

US 2014/0235070 A1    Aug. 21, 2014

(51) Int. Cl.
*G03F 7/16* (2006.01)
*B05C 11/08* (2006.01)
*H01L 21/67* (2006.01)

(52) U.S. Cl.
CPC .......... *H01L 21/6715* (2013.01); *B05C 11/08* (2013.01); *G03F 7/162* (2013.01); *H01L 21/67034* (2013.01)

(58) Field of Classification Search
None
See application file for complete search history.

(56) References Cited

U.S. PATENT DOCUMENTS

| | | | |
|---|---|---|---|
| 4,113,492 A * | 9/1978 | Sato et al. | 430/271.1 |
| 4,800,836 A * | 1/1989 | Yamamoto et al. | 118/52 |
| 5,013,586 A * | 5/1991 | Cavazza | 118/52 |
| 5,211,753 A | 5/1993 | Swain | |
| 5,395,649 A * | 3/1995 | Ikeda | 118/52 |
| 5,591,264 A * | 1/1997 | Sugimoto et al. | 118/320 |
| 5,633,040 A | 5/1997 | Toshima et al. | |
| 5,803,968 A * | 9/1998 | Schwartz et al. | 118/52 |
| 6,013,316 A | 1/2000 | Cubit | |

(Continued)

FOREIGN PATENT DOCUMENTS

| | | |
|---|---|---|
| GB | 1478 480 | 6/1977 |
| JP | S63-076431 A | 4/1988 |

(Continued)

OTHER PUBLICATIONS

International Patent Application Serial No. PCT/US2014/018054, "International Search Report and Written Opinion," dated May 14, 2014, International filing date Feb. 24, 2014.

(Continued)

*Primary Examiner* — Binu Thomas
(74) *Attorney, Agent, or Firm* — Wood Herron & Evans LLP (57) ABSTRACT

Techniques disclosed herein provide an apparatus and method of spin coating that inhibits the formation of wind marks and other defects from turbulent fluid-flow, thereby enabling higher rotational velocities and decreased drying times, while maintaining film uniformity. Techniques disclosed herein include a fluid-flow member, such as a ring or cover, positioned or suspended above the surface of a wafer or other substrate. The fluid-flow member has a radial curvature that prevents wind marks during rotation of a wafer during a coating and spin drying process.

18 Claims, 8 Drawing Sheets

(56) References Cited

U.S. PATENT DOCUMENTS

| | | | |
|---|---|---|---|
| 6,053,977 A | * | 4/2000 | Konishi .................. 118/320 |
| 6,261,635 B1 | | 7/2001 | Shirley |
| 6,616,758 B2 | | 9/2003 | Hung |
| 6,716,285 B1 | | 4/2004 | Weyburne et al. |
| 6,866,431 B2 | | 5/2005 | Namazue et al. |
| 7,018,555 B2 | | 3/2006 | Shimbara |
| 7,323,124 B2 | | 1/2008 | Mizuta |
| 7,566,365 B2 | | 7/2009 | Kobayashi et al. |
| 7,727,853 B2 | | 6/2010 | Takeishi et al. |
| 7,887,728 B2 | | 2/2011 | Takatani et al. |
| 8,225,738 B2 | | 7/2012 | Yoshihara |
| 8,235,062 B2 | | 8/2012 | Lauerhaas et al. |
| 8,387,635 B2 | | 3/2013 | Collins et al. |
| 2006/0057470 A1 | * | 3/2006 | Hata .................. 430/5 |
| 2009/0162547 A1 | | 6/2009 | Sawada |
| 2010/0143586 A1 | | 6/2010 | Ide et al. |
| 2012/0003839 A1 | | 1/2012 | Tomari |
| 2012/0276753 A1 | * | 11/2012 | Yoshihara et al. .......... 118/52 |
| 2015/0004311 A1 | * | 1/2015 | Ichino et al. .............. 118/52 |

FOREIGN PATENT DOCUMENTS

| | | |
|---|---|---|
| JP | H02-048066 A | 2/1990 |
| JP | H07-308625 A | 11/1995 |
| JP | H08-071484 A | 3/1996 |
| JP | 08153668 * | 11/1996 |
| JP | H09-010658 A | 1/1997 |
| JP | H11-345763 A | 12/1999 |
| JP | 2001-179160 A | 7/2001 |

OTHER PUBLICATIONS

Suss MicroTec, Gyrest rotating cover plate, online product description, Garching, Germany, Jun. 23, 2012.
State Intellectual Property Office of People's Republic of China, Office Action and Search Report issued in corresponding Chinese Appln. No. 201480077666.5, dated Jun. 15, 2018, 22 pp. including partial English translation.
Japan Patent Office, Official Action issued in corresponding Japanese Patent Application No. 2016-570760 dated Mar. 20, 2018, 15 pp, including English translation.
Intellectual Property Office of Singapore, English translation of Written Opinion issued in counterpart Singapore Patent Application No. 11201607000W dated Jul. 24, 2017, 7 pp.
The International Bureau of WIPO, International Preliminary Report on Patentability issued in counterpart PCT Application No. PCT/US2014/018054 dated Aug. 30, 2016, 13 pp.
Taiwan Intellectual Property Office, Notification of Examination Opinion issued in counterpart TW Application No. 103106589 dated Apr. 27, 2016, 12 pp. including English translation.

* cited by examiner

COVER PLATE FOR WIND MARK CONTROL IN SPIN COATING PROCESS

FIELD OF INVENTION

Techniques disclosed herein relate to spin coating systems and processes, including spin coating of semiconductor substrates.

BACKGROUND OF THE INVENTION

Spin coating has been used for decades as method to coat a flat surface with a thin layer of polymer, photo resist, or other compound. Spin coating is typically carried out by depositing a solvent solution, polymer solution, or other liquid material onto a flat substrate. The substrate is then rotated at an angular velocity sufficient to create a centrifugal force that causes the solution to flow outward toward the edge of the substrate, thereby coating the entire surface of the substrate. Excess solution is ejected from the edge of the substrate, and the remaining solution thins and hardens as the solvent evaporates, leaving a thin polymer film.

Such spin coating is a routine step in photolithography used in semiconductor device manufacturing. In an example photolithographic process, a resist spin coating step is executed to form a uniform resist film on a semiconductor wafer. Next, an exposure process typically involves exposing the resist film to light or other radiation through a mask that creates a latent line pattern. Finally, a developing step involves developing the resist-coated wafer after an exposure process to reveal the line pattern. Such a series of processing stages is typically carried out in a coating-developing system.

In a typical spin coating process, a semiconductor wafer or other substrate is rotated together with a spin chuck by a rotational drive mechanism. The wafer can be vacuum-fixed on the spin chuck or otherwise held. A resist nozzle positioned above the semiconductor wafer drops a resist solution onto the center of the wafer surface. The dropped resist solution spreads radially outward toward the circumference of the semiconductor wafer by centrifugal force as the wafer spins. Although spreading the resist across the entire wafer surface happens relatively quickly, the semiconductor wafer is continuously rotated (usually at a decreased rotational speed) for a period of time to spin off and dry the resist solution spread over the wafer surface. Such spin coating has been used extensively in the semiconductor industry, primarily to form a thin, uniform layer of photoresist polymer on the surface of a wafer as a preparatory step for further wafer processing.

SUMMARY OF THE INVENTION

A common desire in semiconductor manufacturing and spin coating is to have a high throughput. During semiconductor manufacturing, a wafer can undergo multiple coating and developing steps. Accordingly, minimizing process time to complete each spin coating of a wafer can improve throughput. In other words, it is desirable to complete a spin coat or spin process in as little time as possible to increase a number of wafers that can be processed per unit of time. One challenge with increasing throughput is meeting uniformity and quality requirements. In a typical spin coating process that uses rotation to both spread liquid material across the wafer, and to dry the liquid material, the drying time lasts substantially longer than the spreading time. There are various techniques that can be used to accelerate drying time. One basic technique is to increase a rotational speed of the wafer, which in turn increases a fluid-flow speed across the surface of the wafer—the faster the wafer spins, the faster a liquid resist or other liquid chemical dries (solvent evaporates).

Higher rotational speeds of the substrate, however, can result in non-uniformity and/or defects in the coating. These defects are typically a result of turbulent air flow across the surface of the wafer triggered by relatively faster rotational velocities. One specific problem of higher rotational speeds of the substrate is the development of wind marks, also known as Ekman spirals. This is a phenomenon that results when a wafer is rotated at continually higher angular velocities until fluid-flow (air and solvent) above the wafer transitions from laminar flow to turbulent flow. Just before fully turbulent flow occurs, there is a strong secondary flow that causes a spiral-like pattern on the photoresist surface. These patterns (wind marks) cause defects during later processing steps due to the lack of uniformity of the resist thickness.

For a given substrate diameter, there is maximum speed at which a wafer can be rotated before air flow crosses a threshold and begins to form wind marks in the resist. The threshold for forming wind marks is based on a combination of diameter and angular velocity. The onset of wind marks is correlated with a specific value of a Reynolds number. The Reynolds number for spin coating uses the density of the air above the wafer, angular velocity of the wafer, radial position from the center of the wafer, and viscosity of the air to quantify inertial and viscous forces. The critical Reynolds number identifies the point at which instability occurs. Because of wind marks, the critical Reynolds number limits angular velocity based on an edge radius of a given wafer W. As substrate diameter increases, a maximum angular velocity needs to be reduced because of the increase in tangential velocity at radial distances farther from the axis of rotation. In other words, when spin coating larger discs the spin speed needs to be reduced to prevent wind marks near the edge of the wafer.

This is especially challenging as the semiconductor industry transitions from processing wafers of 300 mm in diameter to wafers of 450 mm in diameter. For example, some conventional spin coating systems for coating 300 mm wafers can spin a wafer up to about 1800 revolutions per minute (rpm), with liquid dispensing and spreading over a few seconds, and with solvent fully evaporating in less than about a minute (depending on the chemical). When the substrate diameter is increased to 450 mm, however, then the spin speed needs to be reduced to around 900 rpm to avoid wind marks. Such a reduction in speed has two significant challenges. One challenge is that at such relatively lower rotational speeds, the liquid does not spread across the wafer surface as uniformly (lower centrifugal force). Another challenge with the lower rotational speed is a dramatic increase in dry time. At the lower rotational speed, solvent evaporation can take up to three or four minutes or more, which means the throughput time per unit of wafer surface area can actually decrease despite the 450 mm wafer more than doubling the area of the 300 mm wafer.

Techniques disclosed herein provide an apparatus and method of spin coating that inhibits the formation of wind marks and other defects from turbulent fluid-flow, thereby enabling higher rotational velocities and decreased drying times, while maintaining film uniformity. Techniques disclosed herein include a fluid-flow member, such as a cover or ring, positioned or suspended above a substrate holder, or rather, above the top surface of a wafer or other substrate.

The fluid-flow member has a radial curvature that prevents wind marks during rotation of a wafer or other substrate.

One embodiment includes a spin coating apparatus having a substrate holder configured to hold a substrate horizontally during a spin coating process, such as by using a vacuum chuck. A rotation mechanism, such as a motor, is connected to the substrate holder. The rotation mechanism is configured to rotate the substrate holder around an axis of rotation. The apparatus includes a liquid dispenser configured to dispense a liquid material onto a working surface of the substrate when the substrate is disposed on the substrate holder. The working surface is generally planar and located opposite to a bottom surface, of the substrate, that contacts the substrate holder. The apparatus includes a fluid-flow member having a substrate-facing surface. The fluid-flow member is configured to be positioned such that the substrate-facing surface is positioned vertically above the working surface of the substrate when the substrate is disposed on the substrate holder. At least a portion of the substrate-facing surface is curved such that a given vertical distance between the substrate-facing surface and the working surface varies radially relative to a given radial distance from the axis of rotation. In other words, while the working surface of the substrate is generally planar, the fluid-flow member suspended above is curved and thus a given height of the substrate-facing surface above the working surface depends on a given radius of the substrate.

Another embodiment includes a method for manufacturing semiconductor devices. This method has multiple steps including positioning a substrate on a substrate holder. The substrate holder holds the substrate horizontally and has an axis of rotation. The substrate has a bottom surface that contacts the substrate holder, and a working surface opposite to the bottom surface. In another step, a fluid-flow member is positioned above the substrate holder. The fluid-flow member has a substrate-facing surface that is positioned vertically above the working surface at a predetermined average vertical distance or average height above the working surface. At least a portion of the substrate-facing surface is curved such that a given vertical distance between the substrate-facing surface and the working surface varies radially relative to a given radial distance from the axis of rotation. A liquid material is dispensed onto the working surface of the substrate via a liquid dispenser positioned above the substrate. The substrate and substrate holder are together spun via a rotation mechanism coupled to the substrate holder such that the liquid material spreads across the working surface of the substrate and then dries by action of rotation.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the embodiments, principles and concepts.

DETAILED DESCRIPTION OF SEVERAL EMBODIMENTS

For purposes of explanation and not limitation, the following description sets forth specific details, such as a particular geometry of a processing system, descriptions of various components and processes used therein. It should be understood, however, that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

Accordingly, techniques disclosed herein provide an apparatus and method of spin coating that inhibits the formation of wind marks and other defects caused by turbulent fluid-flow, thereby enabling higher rotational velocities and decreased drying times, while also maintaining film uniformity. Techniques disclosed herein include a fluid-flow member, such as a cover, ring, or other air flow structure, positioned or suspended above a substrate holder or above a substrate disposed on the substrate holder. The fluid-flow member has a radial curvature selected to prevent wind marks and other effects of turbulent air flow during rotation of a wafer or other substrate. The fluid-flow member is positioned in close proximity to the substrate. The shape, size and position of the fluid-flow member assist in maintaining laminar fluid-flow (typically a solvent and air) across the surface of a wafer coated with a liquid material, and to speed drying times while maintaining uniformity of the coating both in thickness and coverage.

Figure 1:
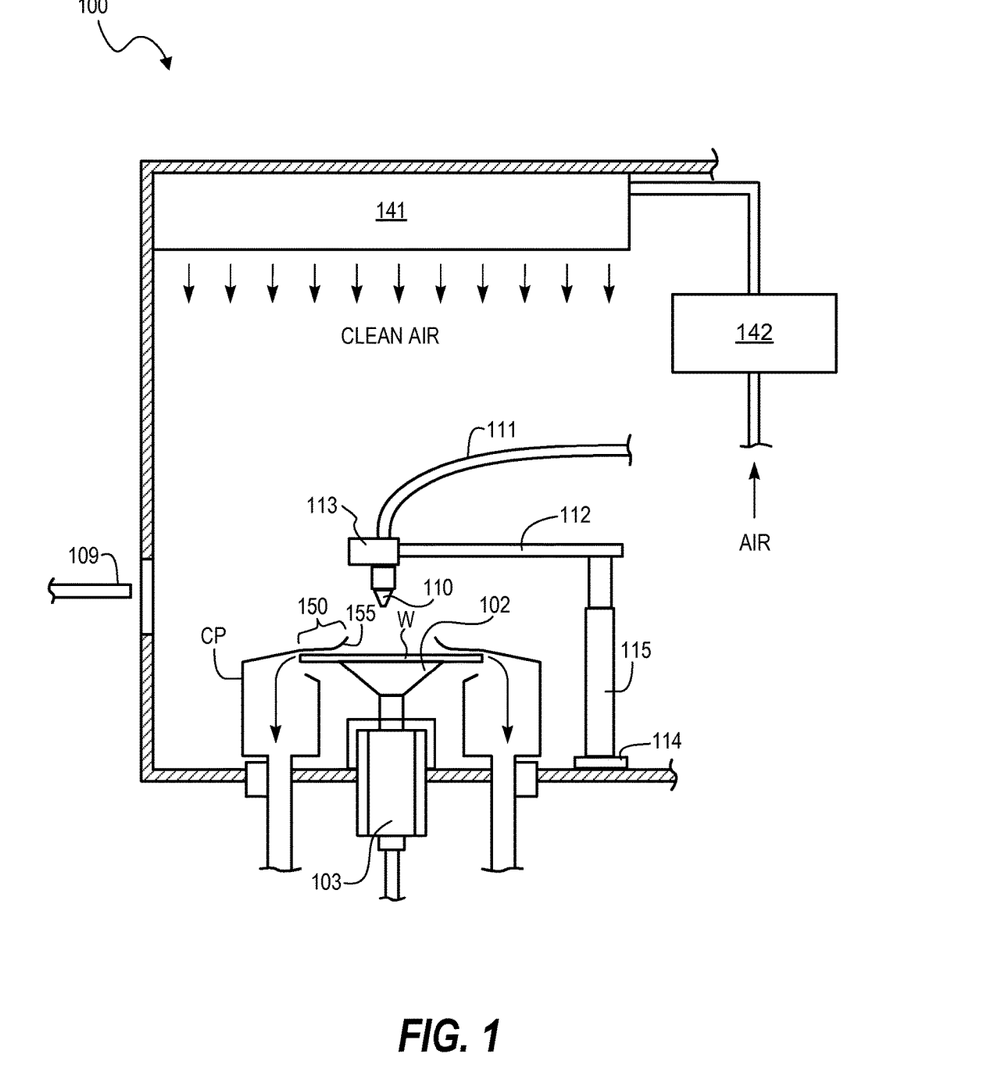
FIG. 1 is a cross-sectional view showing the general structure of a spin coating apparatus.
Figure 2:
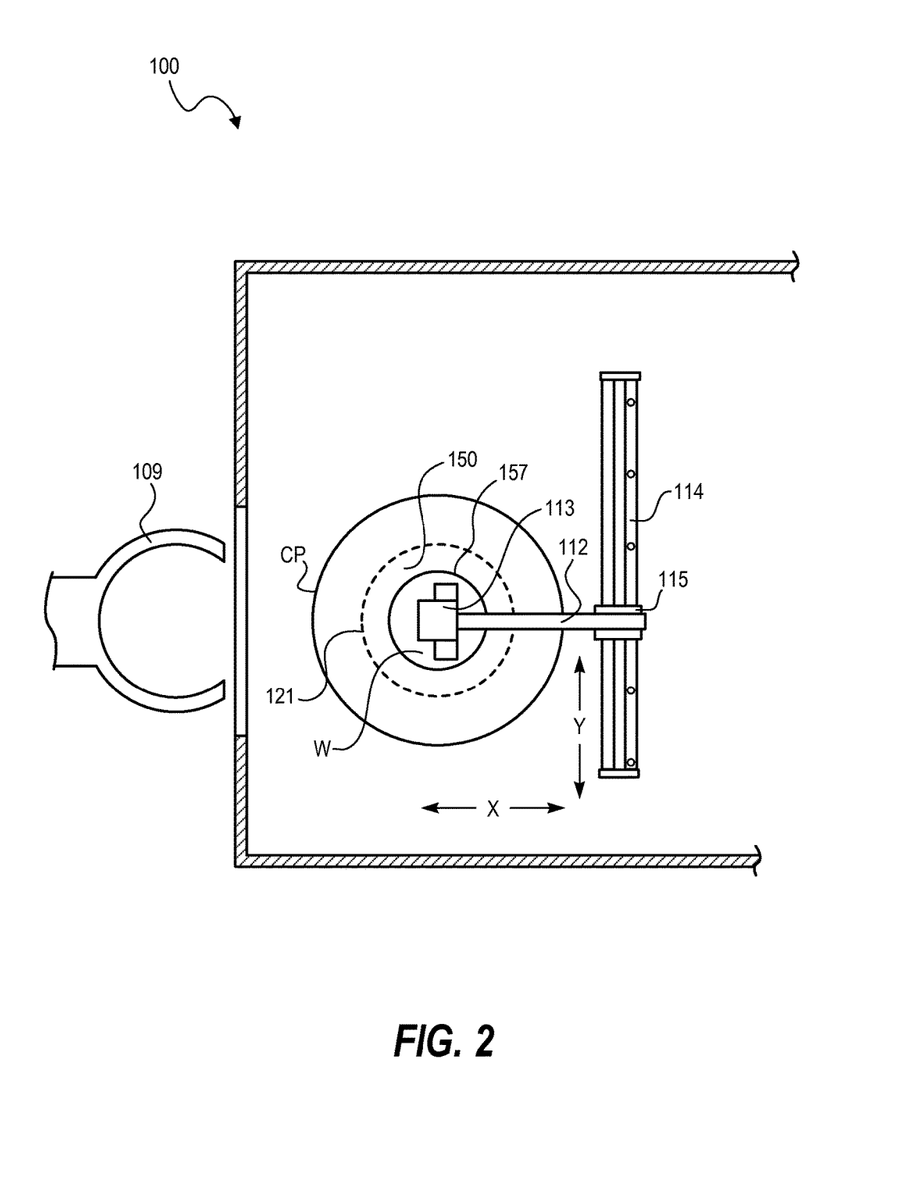
FIG. 2 is a top plan view of a spin coating apparatus of FIG. 1.

Example embodiments will be explained with reference to the accompanying drawings. For convenience, embodiments herein will be described in the context of using a resist in as part of semiconductor fabrication. Note, however, that other liquid materials can also be used for spin coating of semiconductor wafers, or any other generally flat substrate. FIG. 1 is a cross-sectional view showing the general structure of a resist coating unit (COT) 100 (spin coating apparatus). FIG. 2 is a cross-sectional top plan view showing the general structure of the resist coating unit (COT) 100 according to one embodiment of the invention.

A circular cup (CP) is disposed at the center of the resist coating unit 100. A substrate holder 102 (spin chuck) is disposed within the cup CP that catches waste fluid as it flow off the edge of a substrate and then flows down into a drain. The substrate holder 102 is rotated by a rotation mechanism, such as drive motor 103, while a substrate, such as a semiconductor wafer (hereinafter, referred to as "wafer") W, is vacuum-adsorbed on the substrate holder 102. Other substrate holding mechanisms can also be used. The drive motor 103 can be disposed in an opening in the CP, and can optionally include an elevation mechanism that causes the substrate holder 102 to move up-and-down. The elevation mechanism, can be, for example, an air cylinder and include an up-and-down guide unit. The motor can include a cooling unit and be constructed of material advantageous to the spin coating process.

The wafer W can be delivered to the substrate holder 102 by a holding member 109, as part of a wafer transfer mechanism (not shown). The up-and-down drive unit can lift the drive motor 103 and/or the substrate holder 102 upwards to receive wafer W. Alternatively, the cup CP moves up-and-down or separates and widens to allow wafer W to be placed on substrate holder 102.

A liquid dispenser includes a resist nozzle 110 for supplying a resist solution onto the surface of the wafer W, and is connected to a resist supplier through a resist feed pipe 111. The resist nozzle 110 can be removably attached to the leading end of a resist nozzle scan arm 112 through a nozzle holder 113. The resist nozzle scan arm 112 is mounted at the upper end portion of a vertical support member 115 that is horizontally movable on a guide rail 114 in one direction (Y direction). The resist nozzle scan arm 112 therefore moves in the Y direction together with the vertical support member 115 by a Y-direction drive mechanism (not shown). Other mechanisms can be used to move the resist nozzle 110 in the Z-direction and/or X-direction. Resist nozzle 110 can be interchangeable with other resist nozzles of different types or sizes. A solvent atmosphere can be used to prevent the resist solution at the leading end of the nozzle from being solidified or deteriorated.

Resist application can include applying a solvent to function as a thinner for wetting the wafer surface prior to supplying the resist solution to the wafer surface. This initial solvent can be applied with resist nozzle 110 or an adjacently mounted nozzle. Solvents and resists can be supplied via one or more connected feed pipes (not shown), and one or more scan arm assemblies.

A high-efficiency dust collection filter 141 is provided above the wafer W. Air whose temperature and humidity are adjusted by a temperature and humidity controller 142 passes through the high-efficiency dust collection filter 141 to remove dust, so that clean air is supplied into the resist coating unit (COT) 100. Note that a gas containing, for example, a solvent for the resist solution may be introduced instead of air.

A control system or controller (not shown) of the resist coating unit (COT) 100 can be used for controlling and managing various spin coating operations. The controller can include a process controller having a CPU, a user interface, and a memory unit. The user interface is connected to the process controller, and comprises an input device for allowing a process manager to perform a command input operation or the like to control the resist coating unit 100, such as via a display that indicates the visualized operation status of the resist coating unit 100. The memory unit, connected to the process controller, stores a control program (software) for realizing various processes to be executed by the resist coating unit (COT) 100 under the control of the process controller, and recipes having multiple pieces of process condition data or the like.

As a given recipe is called up by an instruction, or like input through the user interface, the resist coating unit (COT) 100 executes a desired process under the control of the process controller. The controller controls, for example, driving of the drive motor 103, a resist supplier, and a solvent supplier. Specifically, the controller controls the drive motor 103 so as to increase or decrease the rotational speed thereof. The controller also controls a timing of supplying the resist solution from the resist supplier to the resist nozzle 110, a timing of supplying a solvent like a thinner from the solvent supplier to the solvent nozzle, and the amounts and type of the resist solution and the solvent to be supplied.

The control program and recipes for the process condition data can be those stored in a computer-readable memory medium, such as a CD-ROM, a hard disk, a flexible disk or a flash memory, or can be transmitted online from another apparatus via an exclusive line for use as needed.

The resist coating unit 100 also includes fluid-flow member 150. In embodiments of FIG. 1 and FIG. 2, fluid-flow member 150 appears integrated with cup CP as a relatively thin structural member. This integration, however, is only one example embodiment. In other embodiments, the fluid-flow member 150 can be attached to an upper structural member within resist coating unit 100, such as being attached to resist nozzle scan arm 112. In embodiments when attached to a scan arm, the fluid-flow member 150 can move aside when wafer W is being placed on, or removed from, substrate holder 102. In other embodiments, the fluid-flow member can be attached adjacent to the cup CP and can include an independent vertical movement mechanism.

In general, fluid-flow member 150 provides a substrate-facing surface 155, with at least a portion of this surface curved in a radial direction relative to an axis of rotation 180 of the substrate holder 102. This results in a curved plate or ring that is positioned over the wafer W (substrate) when the wafer W is disposed on the substrate holder 102. The curvature is such that the fluid-flow member 150 is closer to the wafer W at an outer edge 121 of the wafer W as compared to radial distances closer to the axis of rotation. Also, a height or vertical distance between the fluid-flow member 150 and the wafer W increases moving towards the axis of rotation 180.

Figure 5:
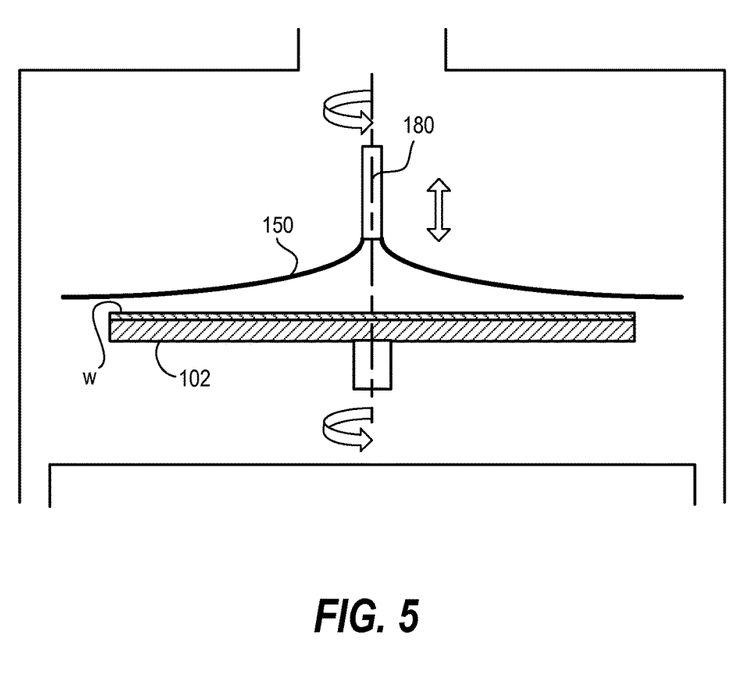
FIG. 5 is a cross-sectional view of an alternative embodiment of a fluid-flow member as described herein.

In some embodiments, such as in FIG. 5, the fluid-flow member 150 can continue a curvature and extend to the axis of rotation 180, thereby resulting in the fluid-flow member having a conical shape. In other embodiments, as in FIG. 2, the fluid-flow member 150 can define an opening 157 above the wafer W to receive resist and air. This allows better control of wind mark formation at the wafer edges, while allowing more air flow in or through the center or opening 157.

Figure 3:
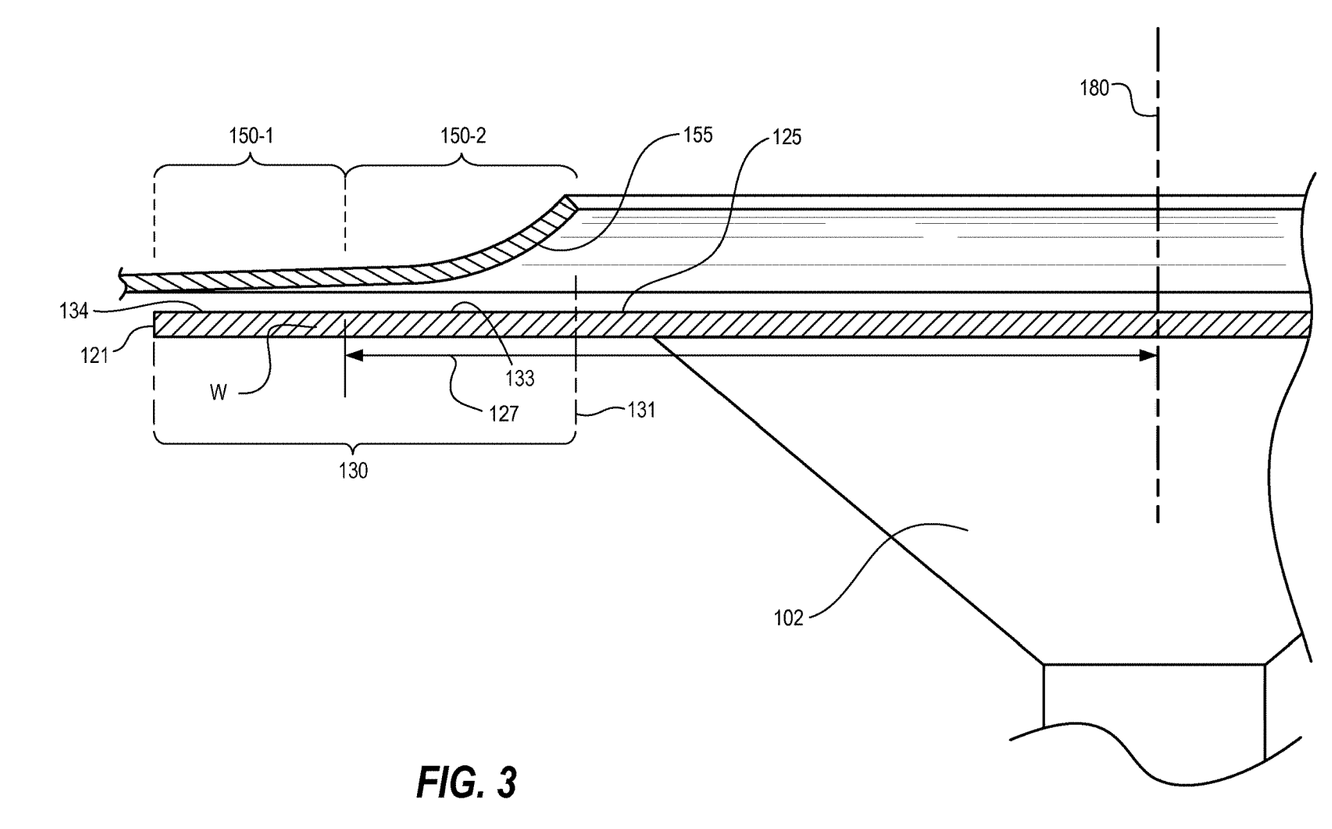
FIG. 3 is an enlarged cross-sectional view of a fluid-flow member according to embodiments herein.

Referring now to FIG. 3, such a curved member above the substrate (wafer) increases laminar flow of air and solvent above a coated substrate, but without creating a bump in the resist where the fluid-flow member begins to cover the substrate, as can be the case with a completely flat ring-shaped covering or a curvature that is either too larger or too small. Such a bump is formed from localized film thickness increase due to increased evaporation. Curvature of the fluid-flow member provides a gradual transition from an inner ring-shaped section 150-2, which is noticeably curved, to an outer ring-shaped section 150-2, which is generally linearly sloped or flat.

Techniques used with this fluid-flow member can include a process of moving the fluid-flow member up and down to prevent defects. For example, having fluid-flow member 150 at an optimal height about the wafer can reduce turbulent flow, but having the fluid-flow member this close during the liquid material (resist) spreading phase can cause defects. When a liquid material is initially dispensed onto a substrate, there can be some splattering as the liquid spreads to the edge of the substrate. If a particle splatters and lands on the fluid-flow member (being initially too close to the wafer), then this particle can later fall back onto the substrate and create a defect. By initially maintaining the fluid-flow member at a position sufficiently high above the wafer W during dispensing of the liquid material, the fluid-flow member avoid any possible splatter, and can then be lowered to an optimal height after the time period of particles splattering has been completed. Then the wafer W can continue to spin dry the liquid material while the fluid-flow member promotes laminar flow of fluid above the surface of the liquid material on the wafer W. The result is preventing wind marks in the resist surface, thereby maintaining uniformity in the layer that forms on the wafer.

Now discussing some example embodiments, one embodiment includes a spin coating apparatus for coating substrates, such as wafer W, though other substrates, such as LCD (liquid crystal display) substrates, can be used. The apparatus includes a substrate holder configured to hold a substrate horizontally during a spin coating process. Vacuum suction is a typical mechanism of holding, but clamping, use of a recess to receive the substrate, or other holding mechanisms can be used. A rotation mechanism is connected to the substrate holder. The rotation mechanism is configured to rotate the substrate holder around an axis of rotation, which simultaneously rotates a substrate on the substrate holder. The apparatus includes a liquid dispenser configured to dispense a liquid material (such as resist) onto a working surface of the substrate when the substrate is disposed on the substrate holder. FIG. 3 shows example working surface 125. The working surface is planar and is opposite to a bottom surface of the substrate where the bottom surface is in contact with the substrate holder. In other words, with a substrate holder that holds a substrate horizontally, the working surface is the top surface.

The apparatus includes a fluid-flow member having a substrate-facing surface 155. The fluid-flow member is configured to be positioned or suspended such that the substrate-facing surface is positioned vertically above the working surface of the substrate when the substrate is disposed on the substrate holder. At least a portion of the substrate-facing surface is curved such that a given vertical distance between the substrate-facing surface and the working surface varies radially relative to a given radial distance from the axis of rotation. In other words, the fluid-flow member has a curvature that changes from edge 121 towards a center of a substrate, which coincides with axis of rotation 180.

In some embodiments, the given vertical distance between the substrate-facing surface 155 and the working surface 125 can vary such that the given vertical distance decreases with increasing radial distance from the axis of rotation. In other words, towards the center of a substrate the fluid-flow member is higher, while at the edge 121 of the substrate the fluid-flow member is lower. The substrate-facing surface can be positioned above a ring-shaped portion 130 of the working surface 125 when the working surface has a circular shape. The ring-shaped portion 130 extends from an outer edge 121 of the working surface to a predetermined radial distance 131 from the axis of rotation 180. The fluid-flow member can define a circular opening vertically above a circular portion of the working surface, with the circular portion extending from the axis of rotation 180 to the predetermined radial distance 131. Thus, the fluid-flow member 150 is suspended above a peripheral portion 130 of the substrate, while a center opening permits air flow from above, such as from dust collection filter 141.

In another embodiment, the substrate-facing surface 155 has an outer ring-shaped section, such as section 150-1, and an inner ring-shaped section, such as section 150-2. The inner ring-shaped section is closer to the axis of rotation 180 than the outer ring-shaped section. The inner ring-shaped section of the substrate-facing surface is curved radially while the outer ring-shaped section of the substrate-facing surface has an approximately linear radial slope. Thus, the noticeably curved portion of the fluid-flow member is closer to the center of the substrate above an inner ring-shaped portion 133 of the working surface 125, while above the edge portion 134 of the working surface 125 of the substrate the fluid-flow member is substantially flat, which could include having a radius substantially large so as to seem approximately linear.

In an alternative embodiment, the inner ring-shaped section 150-2 of the substrate-facing surface 155 is curved radially while the outer ring-shaped section 150-1 of the substrate-facing surface 155 is flat such that when the fluid-flow member is positioned vertically above the working surface 125 of the substrate there is a substantially constant vertical distance between the edge portion 134 of the working surface and the outer ring-shaped section 150-1 of the substrate-facing surface 155. In other words, the inner portion 150-2 is curved, while the outer portion 150-1 of the fluid-flow member has a constant height above the substrate.

Embodiments can include a vertical movement mechanism configured to increase or decrease an average vertical distance between the substrate-facing surface 155 and the working surface 125 when the substrate is disposed on the substrate holder. Since the substrate-facing surface is at least partially curved, there can be a variable height at any given radial distance (but with a same height around the fluid-flow member at a specific radial distance being the same). Accordingly, an average vertical distance can be used to identify vertical movement/positions of the fluid-flow member above the substrate-facing surface, that is, an average suspension distance. The vertical movement mechanism can be configured to set the perpendicular distance between the outer ring-shaped section and the working surface to less than about 5 millimeters or less than about 10 millimeters. Suspending the outer ring-shaped section at about 10 millimeters can improve laminar flow compared to no covering, while having the outer ring-shaped section less than about 5 millimeters, or even less than about 3 or 4 millimeters produces dramatically better laminar flow. The inner ring-shaped section of the substrate-facing surface can have a first radius of curvature between about 20 millimeters and 90 millimeters.

In an alternative embodiment, prior to dispensing the liquid material onto the working surface, the substrate-facing surface is maintained at a predetermined average vertical distance above the working surface for a first period of time. This can be an initial height selected to avoid particles splashing on the substrate-facing surface. The first period of time can be relatively short compared to a total substrate spinning time. For example, this first period of time can be a fraction of a second to one or a few seconds. Subsequent to initiating dispensing the liquid material, the predetermined average vertical distance to a second predetermined average vertical distance via a vertical movement mechanism for a second period of time. This second period of time can be relatively longer than the first period of time. By way of a non-limiting example, the second period of time can be 5 seconds, 10 seconds, 15 seconds or more. During this second period of time the rotational velocity of the substrate can be accelerated. Also, the second predetermined average vertical distance can be relatively close to the substrate such that a shortest vertical distance is around 2 mm. Next, the predetermined average vertical distance is increased to a third predetermined average vertical distance for a third period of time while the substrate remains spinning on the substrate holder. This third period of time can be substantially longer than the second period of time, such as two or three or more times as long. The third predetermined average vertical distance can also have a longer shortest distance to the substrate, such as around 10 or 15 mm or so. With the substrate-facing surface elevated higher above the substrate, a corresponding decrease in rotation speed of the substrate may be implemented to keep flow below a turbulent threshold. Spinning during this third time period can continue until drying is complete or until the wafer can be moved to a hot plate. Thus, a top plate or cover can be lowered at a point in time to avoid splashing but early enough to avoid turbulent effects, the top plate or cover can be raised to assist in maintaining film uniformity. Note that the times and distances given herein are exemplary, and actual time periods, rotational velocities, and distances may be dependent on a given chemical being used and/or recipe steps.

In another embodiment, the substrate-facing surface 155 has an outer ring-shaped section 150-1 and an inner ring-shaped section 150-2. The inner ring-shaped section 150-2 is closer to the axis of rotation 180 than the outer ring-shaped section 150-1. The inner ring-shaped section 150-2 of the substrate-facing surface 155 has a first radius of curvature and the outer ring-shaped section 150-1 of the substrate-facing surface 155 has a second radius of curvature. The second radius of curvature is different from the first radius of curvature. The substrate-facing surface 155 is convex relative to the working surface 125, such as is shown in FIG. 3. The first radius of curvature can be between about 20 millimeters and 90 millimeters, while the second radius of curvature can be between about 1000 millimeters and 2000 millimeters. Alternatively, the first radius of curvature can be between about 50 millimeters and 70 millimeters, while the second radius of curvature can be between about 1300 millimeters and 1500 millimeters.

In some embodiments, the substrate-facing surface defines a shape of a truncated cone being convex relative to the working surface such that a distance between the substrate-facing surface the working surface decreases in a radial direction towards an outer edge of the working surface. While the substrate-facing surface is curved, the fluid-flow member itself can be relatively flat, like a plate, or can be a block having a large thickness. The substrate-facing surface can have a curvature selected to improve drying uniformity during a spin coating process, that is, the shape of a particular curvature can be selected to improve drying uniformity when spin drying the substrate. The given vertical distance between the substrate-facing surface and the working surface that varies can be selected to minimize turbulent fluid flows over the working surface. Note that if the height is relatively large (such as more than 10 centimeters), then there may be little benefit. Likewise, if the height is too small (such as perhaps less than 1 millimeter), then there can be some turbulent flow and/or decrease in uniformity. Thus, the curvature is optimized for uniformity and the height is selected to balance uniformity and turbulence.

Figure 4:
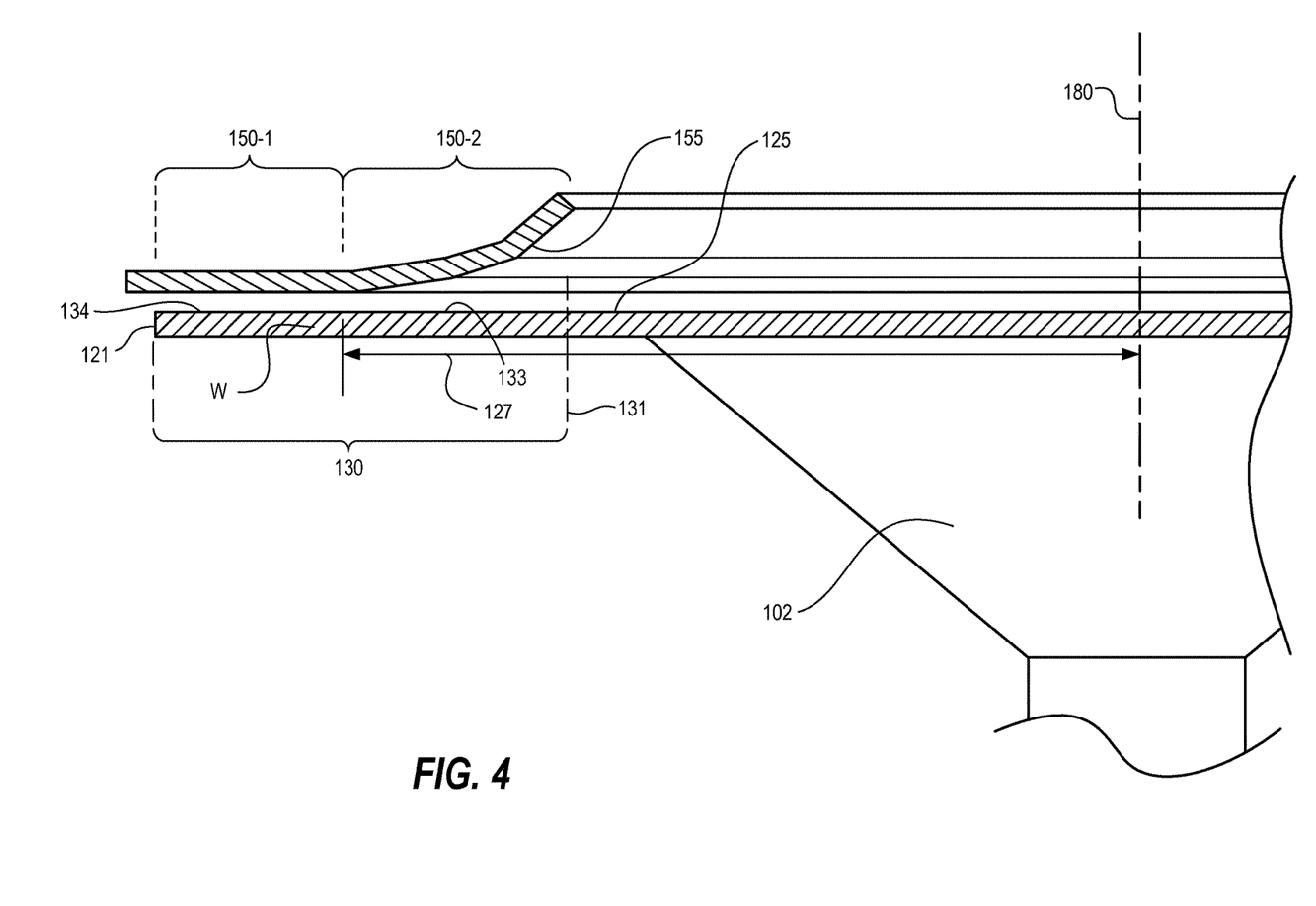
FIG. 4 is an enlarged cross-sectional view of a fluid-flow member according to embodiments herein.

FIG. 4 shows an enlarged cross-sectional view of an example fluid-flow member similar to FIG. 3. Note that while the fluid-flow member of FIG. 4 has an approximate radial curvature, the cross-section shows that substrate-facing surface 155 is comprised of multiple planar (linear) segments. Thus, the substrate-facing surface of the fluid-flow member can be comprised of multiple planar radial segments such that the fluid-flow member has a cross-sectional curvature comprised of multiple linear segments, such as those that can be seen as part of substrate-facing surface 155.

In other embodiments, the substrate-facing surface can be configured to rotate in unison with the substrate holder, as is shown in FIG. 5. Depending on particular materials and process conditions, a uniformity and fluid flow benefit can be obtained with the fluid-flow member rotating with the substrate.

Figure 6A:
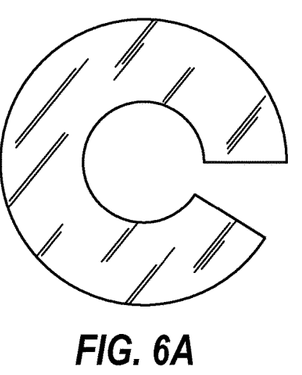
FIGS. 6A-6C are a top view of alternative embodiments of a fluid-flow member as described herein.
Figure 6B:
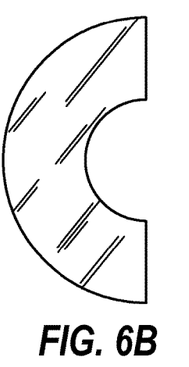
Figure 6C:
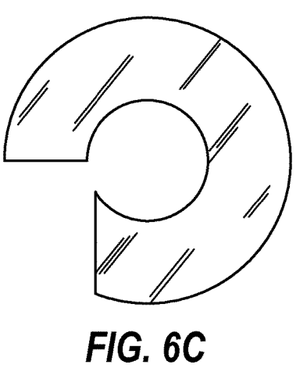

FIG. 6 is a top view of various configurations of the fluid-flow member. In these embodiments, the fluid-flow member defines an opening such that fluid-flow member forms a partial ring above the substrate holder. By way of a non-limiting embodiment, FIG. 6A shows a fluid-flow member defining an angular opening. FIG. 6B shows a fluid-flow member that is essentially a semicircle. FIG. 6C shows another example opening in which line edges of the opening are approximately perpendicular to each other.

Figure 7:
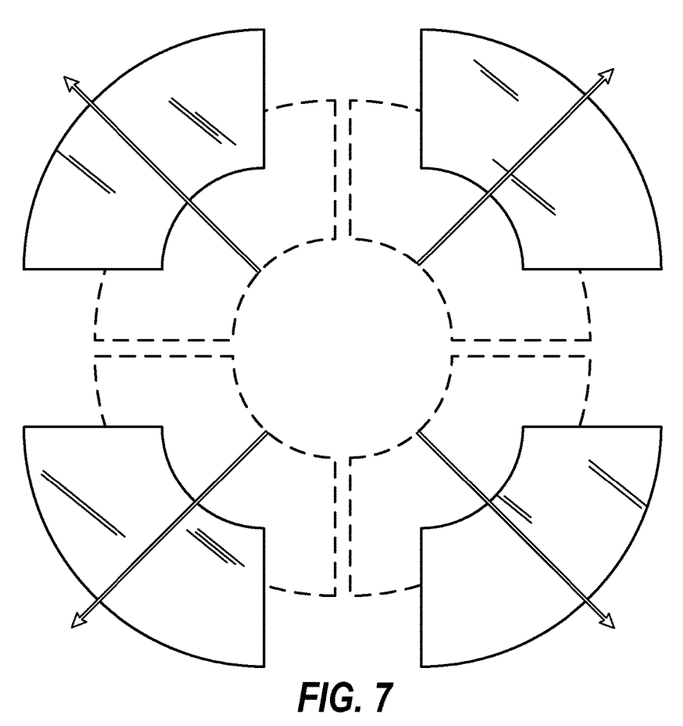
FIG. 7 is a top view of an alternative embodiment of a fluid-flow member as described herein.
Figure 8A:
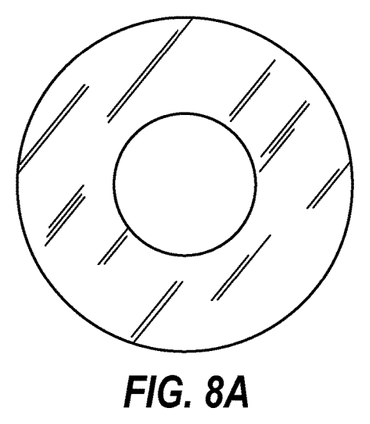
FIGS. 8A-8B are a top view of an alternative embodiment of a fluid-flow member as described herein.
Figure 8B:
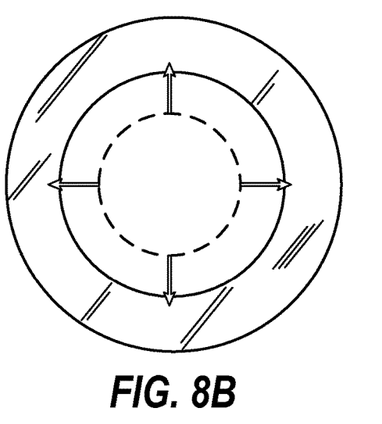

FIG. 7 shows a top view of a dividing fluid-flow member or top plate. In this embodiment, the fluid-flow member is comprised of multiple sections that can be mechanically moved from the substrate holder (either vertically or laterally). Such movement can be useful to allow placing and retrieving substrates on the substrate holder, as well as permitting nozzle arm movement. In one embodiment, each section of the fluid-flow member can be attached to an arm that can be moved so that no part of the fluid-flow member covers a wafer. Each arm can be moved in unison with other arms to form a contiguous fluid-flow member. The sections can also be moved apart a relatively small distance to better optimize the balance between thickness uniformity and turbulence control. Thus, one embodiment includes a fluid-flow member comprising two or more segments (for example four segments) such that at least one segment is configured to be moved away from an adjacent segment. Note that such segments can have a radial curvature as described above, or be essentially planar segments that form a generally flat substrate-facing surface.

Figure 9:
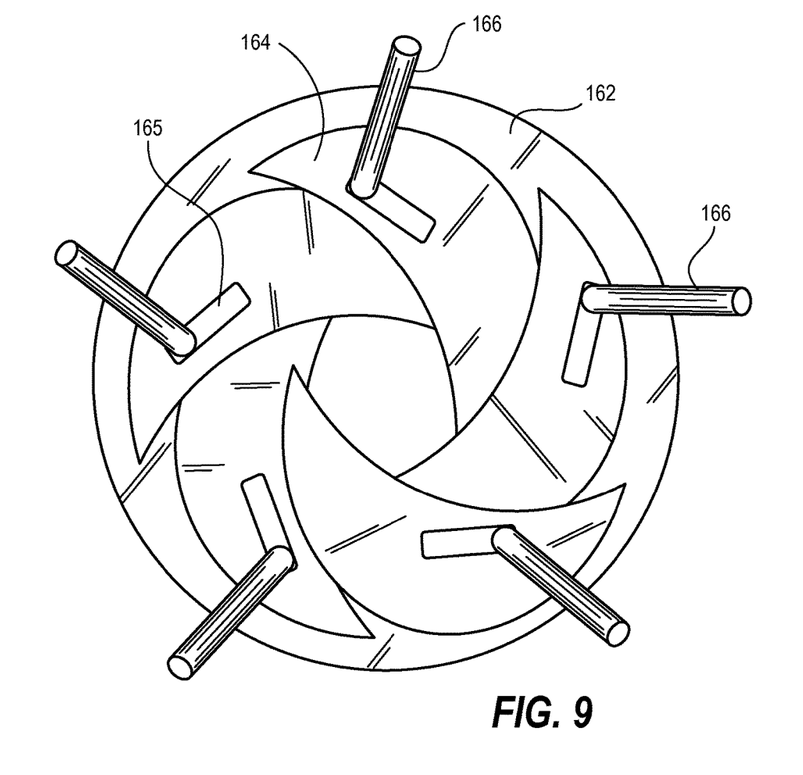
FIG. 9 is a top view of an alternative embodiment of a fluid-flow member having an adjustable opening as described herein.
Figures 10, 11:
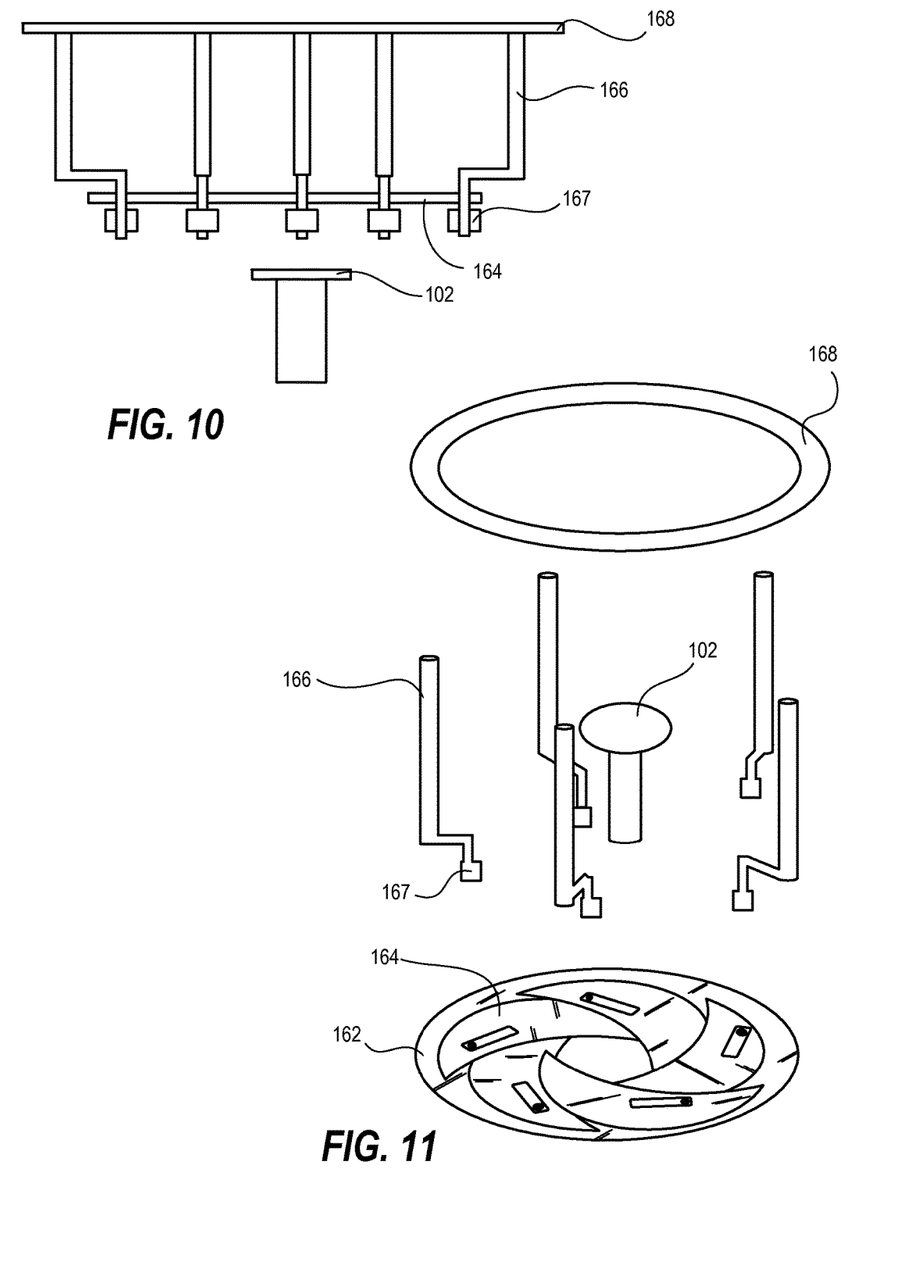
FIG. 10 is a side view of an alternative embodiment of a fluid-flow member having an adjustable opening as described herein.
FIG. 11 is an exploded perspective view of an alternative embodiment of a fluid-flow member having an adjustable opening as described herein.

FIGS. 8-11 are diagrams illustrating a fluid-flow member with a dynamically changing center opening. FIGS. 8A and 8B show a top view of a fluid-flow member having an opening with a given diameter, and that this given diameter increases, thereby shrinking a total surface area of the fluid-flow member. FIG. 9 is a top view of one example embodiment of such a fluid-flow member defining an approximately circular opening centered around the axis of rotation (of the substrate holder/wafer), while FIG. 10 shows a side view, and FIG. 11 shows an exploded, perspective view. This fluid-flow member is configured such that a diameter of the defined opening can be increased and/or decreased. The example shown embodies this technique as essentially a diaphragm or shutter-style opening.

The fluid-flow member can include a diaphragm member and a ring-shaped base plate 162. The diaphragm member can include several components such as blades 164 and rods 166. Rods 166 can pass through slots 165, of blades 164, and hold blades via a fastener 167. Rods 166 can also be attached to a mounting ring 168. Movement of the mounting ring 168 is such that rotating the mounting ring causes the blades to increase and/or decrease the diameter of the defined opening. As the mounting ring 168 is rotated, the rods 166 can move through slots 165, thereby causing the blades 164 to reposition themselves, such as be sliding across each other. This in turn increases or decreases the defined opening. Thus, in this embodiment the fluid-flow member can be considered a ring that has an adjustable inner radius or diameter. With such adjustability, the fluid-flow member can be dynamically adjusted for particular applications.

Other embodiments can include a method for manufacturing semiconductor devices, with this method comprising several steps. A substrate is positioned on a substrate holder, such as by using a robotic arm. The substrate holder holds the substrate horizontally. The substrate holder has an axis of rotation. The substrate has a bottom surface that contacts the substrate holder, and has a working surface opposite to the bottom surface. A fluid-flow member is positioned above the substrate holder. The fluid-flow member has a substrate-facing surface such that positioning the fluid-flow member includes positioning the substrate-facing surface vertically above the working surface at a predetermined average vertical distance above the working surface. At least a portion of the substrate-facing surface is curved such that at a given vertical distance between the substrate-facing surface and the working surface varies radially relative to a given radial distance from the axis of rotation. A liquid material, such as a resist, is dispensed onto the working surface of the substrate via a liquid dispenser positioned above the substrate. The substrate and substrate holder then spin via a rotation mechanism coupled to the substrate holder such that the liquid material spreads across the working surface of the substrate.

In another embodiment, prior to dispensing the liquid material onto the working surface the substrate-facing surface is maintained at the predetermined average vertical distance above the working surface, and subsequent to initiating dispensing the liquid material the predetermined average vertical distance is decreased to a second predetermined average vertical distance via a vertical movement mechanism. The substrate-facing surface has an outer ring-shaped section and an inner ring-shaped section, the inner ring-shaped section being closer to the axis of rotation than the outer ring-shaped section. The inner ring-shaped section of the substrate-facing surface is curved radially while the outer ring-shaped section of the substrate-facing surface has an approximately linear radial slope, such that decreasing the predetermined average vertical distance to the second predetermined average vertical distance results in the outer section of the substrate-facing surface being positioned less than about 4 millimeters from the working surface. The outer section extends beyond a radial distance 127 of about 80-120 millimeters from the axis of rotation when the working surface has a diameter of about 300 millimeters. The outer section extends beyond a radial distance 127 of about 100-170 millimeters from the axis of rotation when the working surface has a diameter of about 450 millimeters.

Note that there are several variables that can affect a maximum angular velocity using the fluid-flow member. For example, an optimal pressure can be helpful for promoting laminar flow. With a pressure too low, back flow conditions can develop causing turbulence. Other variables include type of substrate and type of liquid material. It is typical for wafers to be circular or disc-shaped, though such a shape is not required and the spin apparatus can function with rectangular and other shapes of substrates. There are numerous different types of resist and solvents that can be selected. Each solvent can have respective flow and evaporation characteristics. Thus, it should be understandable that adjustments can be made to the fluid-flow member, average height, and rotational velocity based on substrate and resist characteristics to yield optimal dry time and film uniformity. For example, for commonly used resists in semiconductor manufacturing on a wafer, it is advantageous for a relatively large section of the outer diameter to have a vertical distance—between the working surface and the substrate-facing surface—that is less than about 3 millimeters. By way of a non-limiting example, when processing a wafer having a radius of 150 mm, having the vertical distance beyond about 110 mm (about 165 mm for a 225 mm radius wafer) set to less than about 3 mm, and even tapering to about 1.5 mm, results in dramatically improved laminar flow for higher rotational velocities, such as up to 2800 rpms or more.

Other embodiments include decreasing the first predetermined average vertical distance to the second predetermined average vertical distance within a predetermined time from initiating dispensing of the liquid material onto the working surface. By way of a non-limiting embodiment, a resist is deposited on a substrate, the substrate is spun and after about a second the resist covers the substrate allowing the substrate-facing surface to be lowered to promote laminar fluid flow while spin drying. Also, in another embodiment, the substrate-facing surface can be rotated in a same rotational direction as the substrate holder such that the substrate-facing surface rotates at about a same angular velocity as the working surface.

Other embodiments include methods for changing cup exhaust in different recipe steps to optimize the balance between film thickness uniformity and particle generation while maintaining turbulence control. Having a relatively low exhaust rate is generally better for film thickness uniformity when using a top plate (fluid-flow member), that is, relatively low exhaust rate results in a more uniform film thickness. One competing interest, however, is that having an exhaust rate lower than a certain value can result in particles landing on a wafer being processed. This danger can be higher with particular process steps, and so methods can include increasing exhaust during specific process steps having a higher probability of receiving particle contaminates. Moreover, if exhaust is too low, there is a potential for pressure to build in the spin coating module and push particles into other parts of the wafer fabrication system. Thus, higher exhaust rates typically result in less defects, while lower exhaust rates typically result in better uniformity. Accordingly, techniques can include adjusting exhaust rates, in combination with using the fluid-flow member, to keep defects below a predetermined amount and to keep a uniformity above a predetermined value.

The fluid-flow member and methods herein can improve uniformity to various degrees depending on process conditions and liquid material properties. For example, based on a particular selection of pressure, temperature, and type of liquid material, techniques herein can enable rotation of a 300 mm substrate up to about 2800-3200 rpm without turbulent effects, and rotation of a 450 mm substrate up to about 1200-1400 rpm or more without turbulent effects.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A spin coating apparatus for coating substrates, the spin coating apparatus comprising:
   a substrate holder configured to hold a substrate horizontally during a spin coating process;
   a rotation mechanism connected to the substrate holder, the rotation mechanism configured to rotate the substrate holder around an axis of rotation;
   a liquid dispenser configured to dispense a liquid material onto a working surface of the substrate when the substrate is disposed on the substrate holder, the working surface having a circular shape and being planar and opposite to a bottom surface of the substrate that contacts the substrate holder; and
   a ring-shaped fluid-flow member having a substrate-facing surface, the fluid-flow member configured to be positioned such that the substrate-facing surface is positioned vertically above a ring-shaped portion of the working surface of the substrate when the substrate is disposed on the substrate holder, the ring-shaped portion of the working surface extending from an outer edge of the working surface to a predetermined radial distance from the axis of rotation, the substrate-facing surface being curved such that a given vertical distance between the substrate-facing surface and the working surface varies radially relative to a given radial distance from the axis of rotation,
   wherein the substrate-facing surface has an outer ring-shaped section and an inner ring-shaped section, the inner ring-shaped section being closer to the axis of rotation than the outer ring-shaped section, the inner ring-shaped section of the substrate-facing surface is positioned above an inner portion of the ring-shaped portion of the working surface and has a first radius of curvature and the outer ring-shaped section of the substrate-facing surface is positioned above an edge portion of the ring-shaped portion of the working surface and has a second radius of curvature, the second radius of curvature being different from the first radius of curvature, the substrate-facing surface being convex relative to the working surface.

2. The spin coating apparatus of claim 1, wherein the given vertical distance between the substrate-facing surface and the working surface varies such that the given vertical distance decreases with increasing radial distance from the axis of rotation.

3. The spin coating apparatus of claim 1, wherein the fluid-flow member defines a circular opening vertically above a circular portion of the working surface, the circular portion extending from the axis of rotation to the predetermined radial distance.

4. The spin coating apparatus of claim 1, wherein the first radius of curvature is between about 20 millimeters and 90 millimeters, and wherein the second radius of curvature is between about 1000 millimeters and 2000 millimeters.

5. The spin coating apparatus of claim 4, wherein the first radius of curvature is between about 50 millimeters and 70 millimeters, and wherein the second radius of curvature is between about 1300 millimeters and 1500 millimeters.

6. The spin coating apparatus of claim 1, wherein the substrate-facing surface defines a shape of a truncated cone being convex relative to the working surface such that a distance between the substrate-facing surface and the working surface decreases in a radial direction towards an outer edge of the working surface.

7. The spin coating apparatus of claim 1, wherein the fluid-flow member comprises two or more segments such that at least one segment is configured to be moved away from an adjacent segment.

8. The spin coating apparatus of claim 7, wherein the fluid-flow member comprises four segments such that each segment is configured to be mechanically moved away from adjacent segments.

9. The spin coating apparatus of claim 1, wherein the substrate-facing surface of the fluid-flow member comprises multiple planar radial segments such that the fluid-flow member has a cross-sectional curvature comprised of multiple linear segments.

10. The spin coating apparatus of claim 1, wherein the fluid-flow member defines an opening such that the fluid-flow member forms a partial ring above the substrate holder.

11. A spin coating apparatus for coating substrates, the spin coating apparatus comprising:
   a substrate holder configured to hold a substrate horizontally during a spin coating process;
   a rotation mechanism connected to the substrate holder, the rotation mechanism configured to rotate the substrate holder around an axis of rotation;
   a liquid dispenser configured to dispense a liquid material onto a working surface of the substrate when the substrate is disposed on the substrate holder, the working surface having a circular shape and being planar and opposite to a bottom surface of the substrate that contacts the substrate holder; and a ring-shaped fluid-flow member having a substrate-facing surface, the fluid-flow member configured to be positioned such that the substrate-facing surface is positioned vertically above a ring-shaped portion of the working surface of the substrate when the substrate is disposed on the substrate holder, the ring-shaped portion of the working surface extending from an outer edge of the working surface to a predetermined radial distance from the axis of rotation, a portion of the substrate-facing surface being curved such that a given vertical distance between the substrate-facing surface and the working surface varies radially relative to a given radial distance from the axis of rotation, wherein the substrate-facing surface has a linear outer ring-shaped section and a curved inner ring-shaped section, the curved inner ring-shaped section being closer to the axis of rotation than the linear outer ring-shaped section, the curved inner ring-shaped section of the substrate-facing surface is positioned above an inner portion of the ring-shaped portion of the working surface and has a radius of curvature and the linear outer ring-shaped section of the substrate-facing surface is positioned above an edge portion of the ring-shaped portion of the working surface.

12. The spin coating apparatus of claim 11, wherein the given vertical distance between the substrate-facing surface and the working surface varies such that the given vertical distance decreases with increasing radial distance from the axis of rotation.

13. The spin coating apparatus of claim 11, wherein the fluid-flow member defines a circular opening vertically above a circular portion of the working surface, the circular portion extending from the axis of rotation to the predetermined radial distance.

14. The spin coating apparatus of claim 11, wherein the linear outer ring-shaped section of the substrate-facing surface has an approximately a linear radial slope.

15. The spin coating apparatus of claim 11, wherein the linear outer ring-shaped section of the substrate-facing surface is flat such that when the fluid-flow member is positioned vertically above the working surface of the substrate there is a substantially constant vertical distance between the working surface and the linear outer ring-shaped section of the substrate-facing surface.

16. The spin coating apparatus of claim 15, further comprising a vertical movement mechanism configured to increase or decrease an average vertical distance between the substrate-facing surface and the working surface when the substrate is disposed on the substrate holder.

17. The spin coating apparatus of claim 16, wherein the vertical movement mechanism is configured to set a perpendicular distance between the outer ring-shaped section and the working surface to less than about 5 millimeters.

18. The spin coating apparatus of claim 15, wherein the radius of curvature of the inner ring-shaped section of the substrate-facing surface is between about 20 millimeters and 90 millimeters.

* * * * *

UNITED STATES PATENT AND TRADEMARK OFFICE
CERTIFICATE OF CORRECTION

PATENT NO. : 10,262,880 B2
APPLICATION NO. : 13/770771
DATED : April 16, 2019
INVENTOR(S) : Derek Bassett et al.

Page 1 of 1

It is certified that error appears in the above-identified patent and that said Letters Patent is hereby corrected as shown below:

In the Claims

Column 16, Lines 9-11, Claim 14, change "The spin coating apparatus of claim 11, wherein the linear outer ring-shaped section of the substrate-facing surface has an approximately a linear radial slope" to --The spin coating apparatus of claim 11, wherein the linear outer ring-shaped section of the substrate-facing surface has a linear radial slope--.

Signed and Sealed this
Sixteenth Day of July, 2019

Andrei Iancu
*Director of the United States Patent and Trademark Office*